(12) United States Patent
Jang

(10) Patent No.: US 11,302,877 B2
(45) Date of Patent: Apr. 12, 2022

(54) MANUFACTURING METHOD OF FLEXIBLE DISPLAY PANEL AND BASE SUBSTRATE FOR MANUFACTURING FLEXIBLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Woosung Jang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 406 days.

(21) Appl. No.: 16/478,946

(22) PCT Filed: May 9, 2019

(86) PCT No.: PCT/CN2019/086284
§ 371 (c)(1),
(2) Date: Jul. 18, 2019

(87) PCT Pub. No.: WO2020/215383
PCT Pub. Date: Oct. 29, 2020

(65) Prior Publication Data
US 2021/0359233 A1 Nov. 18, 2021

(30) Foreign Application Priority Data
Apr. 25, 2019 (CN) .......................... 201910340692.7

(51) Int. Cl.
H01L 51/00 (2006.01)
H01L 27/32 (2006.01)
H01L 51/56 (2006.01)

(52) U.S. Cl.
CPC ...... H01L 51/0097 (2013.01); H01L 27/3244 (2013.01); H01L 51/003 (2013.01); H01L 51/56 (2013.01); H01L 2227/326 (2013.01); H01L 2251/5338 (2013.01); H01L 2251/566 (2013.01)

(58) Field of Classification Search
None
See application file for complete search history.

(56) References Cited

U.S. PATENT DOCUMENTS

2019/0074465 A1* 3/2019 Jung ................... H01L 51/0021

* cited by examiner

Primary Examiner — J. E. Schoenholtz

(57) ABSTRACT

The present invention provides a manufacturing method of a flexible display panel and a base substrate for manufacturing a flexible display panel. In the manufacturing method, a flexible substrate is first coated on a base substrate having base protrusions. Then, flexible protrusions arranged on the flexible substrate and corresponding to the base protrusions are laser cut to form first openings in the flexible substrate. Next, a display function layer is formed on the flexible substrate and the base protrusions. After that, the flexible substrate is removed from the base substrate, and the display function layer is laser cut to form second openings arranged corresponding to the first openings.

9 Claims, 4 Drawing Sheets

MANUFACTURING METHOD OF FLEXIBLE DISPLAY PANEL AND BASE SUBSTRATE FOR MANUFACTURING FLEXIBLE DISPLAY PANEL

1. FIELD OF DISCLOSURE

The present invention relates to a field of display devices and in particular, to a manufacturing method of a flexible display panel and a base substrate for manufacturing a flexible display panel.

2. DESCRIPTION OF RELATED ART

In flat panel display technology, organic light-emitting diode (OLED) displays have advantages such as being thin and light, active illumination, fast response, large viewing angle, wide color gamut, high brightness, and low power consumption, and can be used for making flexible panels. Hence, there has been a growing interest for scientific community and industries to develop and apply OLED displays, and the OLED displays gradually become a third generation display technology after liquid crystal displays (LCDs).

In regard to consumers' requirements for display screens, like mobile phones for example, consumers have no interests in a mobile phone which has a large overall size and a small display area, and they will only pursue a larger screen and a higher screen ratio. For example, the iPhone X phone uses a Notch screen design, which can achieve a screen ratio of 81.15%. Nowadays, a "full screen" design has become the mainstream, so all suppliers focus on developing full-screen products with higher screen ratios. The OLED displays, with their flexibility, play a vital role in full-screen displays.

A flexible OLED display is a flexible display device made of a flexible substrate, usually a flexible polyimide (PI) substrate. The flexible PI substrate is formed by coating a PI film on a common glass substrate, and after an OLED device is fabricated, the flexible PI substrate is removed from the glass substrate by laser cutting.

A zero bezel design is gradually realized in a display screen of the mobile phone. In FIG. 1, a camera is disposed behind a display screen 1, and a mounting hole 5 for mounting the camera is arranged in a display area of the display screen 1. However, for flexible OLED displays, it is difficult to make holes in the PI substrate due to its large thickness and high viscosity of PI. Therefore, there is a need to provide a new manufacturing method of a flexible display panel to solve the above problems.

SUMMARY

It is an objective for the present invention to provide a manufacturing method of a flexible display panel, which can effectively reduce difficulty in making an opening in a flexible display panel and improve production yields of the flexible display panel.

It is another objective for the present invention to provide a base substrate for manufacturing a flexible display panel, which can effectively reduce difficulty in making an opening in a flexible display panel and improve production yields of the flexible display panel.

Accordingly, the present invention provides a manufacturing method of a flexible display panel, comprising steps as follows:

S1: providing a base substrate which comprises a plurality of base protrusions thereon, and coating a flexible substrate on the base substrate and the base protrusions, wherein the flexible substrate comprises a plurality of flexible protrusions disposed corresponding to the base protrusions;

S2: removing the flexible protrusions by laser cutting, and forming a plurality of first openings in the flexible substrate;

S3: forming a display function layer on the flexible substrate and the base protrusions;

S4: separating the base substrate from the flexible substrate, and removing the flexible substrate from the base substrate;

S5: cutting the display function layer by laser cutting, and forming in the display function layer a plurality of second openings disposed corresponding to the first openings.

In step S1, the base protrusions and the base substrate are made of a same material.

In step S1, the base substrate is a glass substrate.

In step S1, each of the base protrusions is a cylindrical shape.

Each of the base protrusions has a diameter of 2 to 3 mm and a height of 6 to 10 μm.

In step S1, the flexible substrate is a polyimide substrate.

In step S1, forming the flexible substrate comprises coating the base substrate with a layer of polyimide, and baking the layer of polyimide to obtain the flexible substrate made of polyimide.

In step S2, an upper side of the flexible substrate is cut by laser cutting to remove the flexible protrusions.

In step S4, one side of the flexible substrate adjacent to the base substrate is laser scanned to separate the base substrate from the flexible substrate; and in step S5, an upper side or both upper and lower sides of the display function layer are cut by laser cutting.

The present invention further provides a base substrate for manufacturing a flexible display panel, wherein the flexible display panel comprises a flexible substrate and a display function layer disposed on the flexible substrate, a plurality of first openings are defined in the flexible substrate, a plurality of second openings disposed corresponding to the first openings are defined in the display function layer, a plurality of base protrusions are disposed on the base substrate for manufacturing the flexible display panel, the flexible substrate is coated on the base substrate for manufacturing the flexible display panel, and the base protrusions are disposed corresponding to the first openings in flexible substrate.

The base protrusions and the base substrate for manufacturing the flexible display panel are made of a same material, and the base substrate for manufacturing the flexible display panel is a glass substrate.

Each of the base protrusions is a cylindrical shape, and each of the base protrusions has a diameter of 2 to 3 mm and a height of 6 to 10 μm.

Advantages of the present invention: The present invention provides a manufacturing method of a flexible display panel. First, a flexible substrate is coated on a base substrate where base protrusions are disposed. Flexible protrusions of the flexible substrate, which are disposed corresponding to the base protrusions, are laser cut to form first openings in the flexible substrate. Then, a display function layer is formed on the flexible substrate and the base protrusions. Finally, the flexible substrate is removed from the base substrate, and the display function layer is cut by laser cutting to form second openings which are arranged corresponding to the first openings and defined in the display function layer. By means of the base protrusions disposed on the base substrate, the first openings can be formed in the flexible substrate, and then the display function layer alone is cut to form the second openings disposed corresponding to the first openings. This can effectively reduce difficulty of making openings in the flexible display panel. The present invention provides a base substrate for manufacturing a flexible display panel. The base substrate is provided with base protrusions for forming first openings in the flexible substrate, which can effectively reduce difficulty of making openings in the flexible display panel and improve production yields of the flexible display panel.

In order to further understand features and technical contents of the present invention, a detailed description is provided hereinafter with reference to accompanying drawings. However, the accompanying drawings are only for ease of understanding but not intended to limit the present invention.

BRIEF DESCRIPTION OF DRAWINGS

The technical solutions and other advantageous effects of the present invention will be apparent from the following detailed description with reference to the accompanying drawings. In the drawings.

DETAILED DESCRIPTION OF EMBODIMENTS

In order to further clarify technical features and effects of the present invention, a following detailed description is provided in conjunction with preferable embodiments of the present invention and the accompanying drawings.

Figure 1:
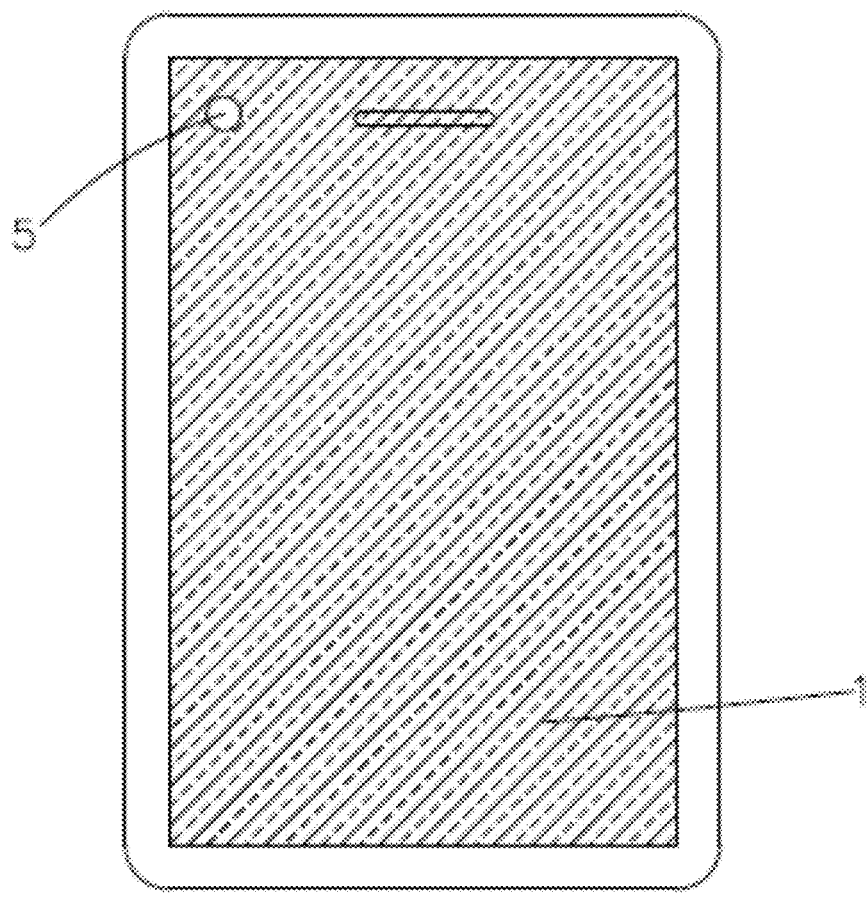
FIG. 1 is a schematic view illustrating a camera disposed in a display area of a display screen of a mobile phone.
Figure 2:
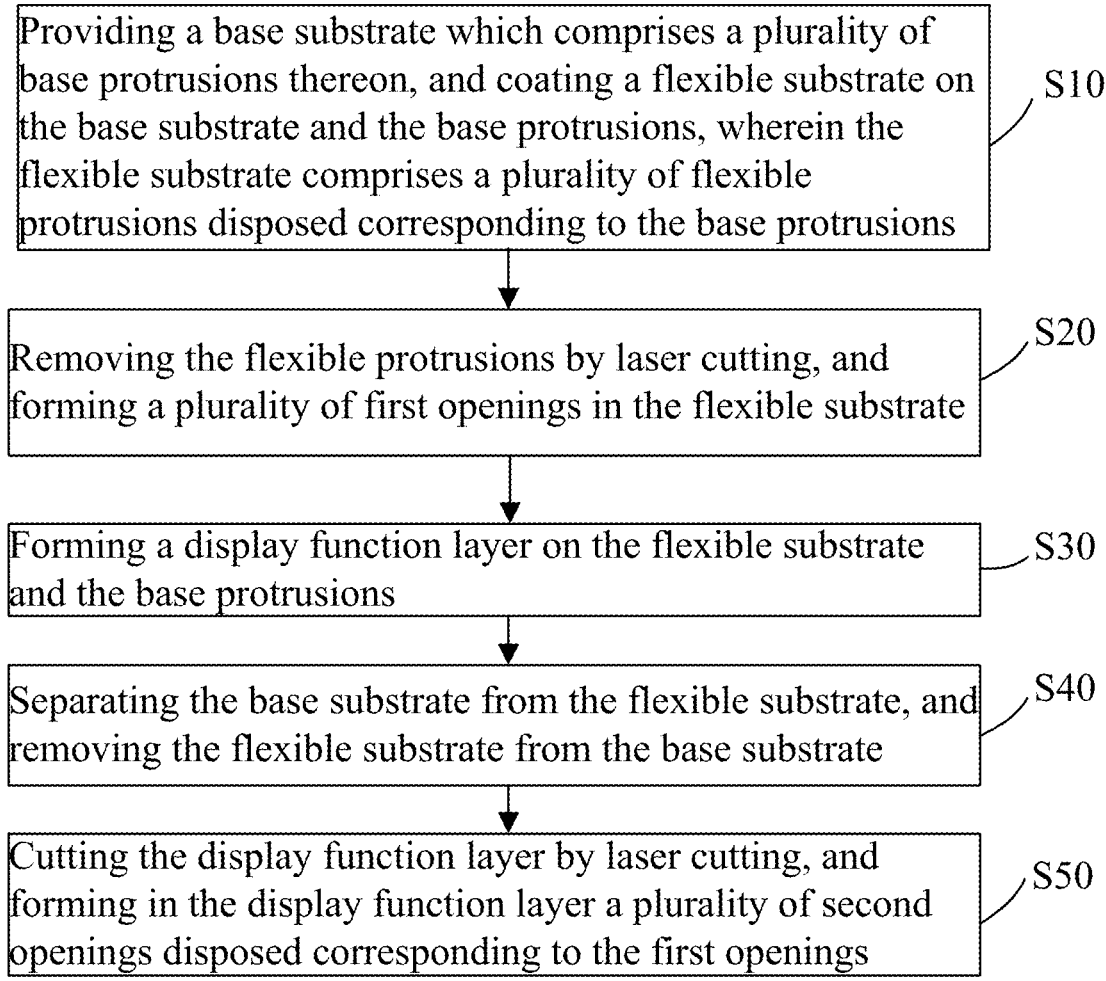
FIG. 2 is a process flow diagram illustrating a manufacturing method of a flexible display panel according to the present invention.

Referring to FIG. 2, the present invention provides a manufacturing method of a flexible display panel, comprising steps as follows.

Figure 4:
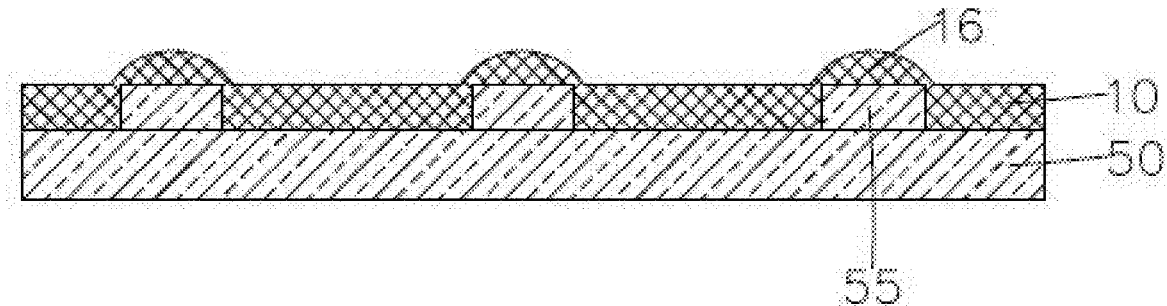
FIG. 4 is a schematic view illustrating step S1 in the manufacturing method of the flexible display panel.

Step S1: as shown in FIG. 4, providing a base substrate 50 which comprises a plurality of base protrusions 55 thereon, and coating a flexible substrate 10 on the base substrate 50 and the base protrusions 55, wherein the flexible substrate 10 comprises a plurality of flexible protrusions 16 disposed corresponding to the base protrusions 55.

Specifically, in step S1, the flexible substrate 10 is a polyimide substrate. Forming the flexible substrate 10 in step S1 comprises coating the base substrate 50 with a layer of polyimide, and baking the layer of polyimide to obtain the flexible substrate 10 made of polyimide.

Specifically, the base substrate 50 provided in step S1 is a glass substrate. The base protrusions 55 and the base substrate 50 are made of the same material.

Figure 3:
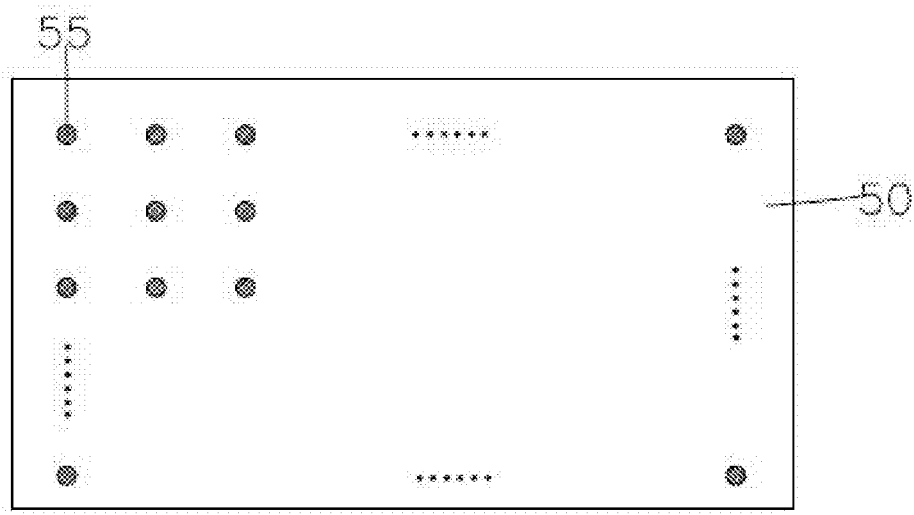
FIG. 3 is a schematic planar view illustrating a base substrate in step S1 in a manufacturing method of a flexible display panel.

Specifically, as shown in FIG. 3, in step S1, a plurality of the substrate protrusions 55 are disposed corresponding to positions where camera openings are to be formed in the flexible display panel so as to raise a height of the base substrate 50 in these positions. After the flexible substrate 10 is formed by coating, a thickness of the flexible substrate 10 at edges of the base protrusions 55 is thin, thereby facilitating subsequent cutting the flexible substrate 10 to form openings.

Figure 5:
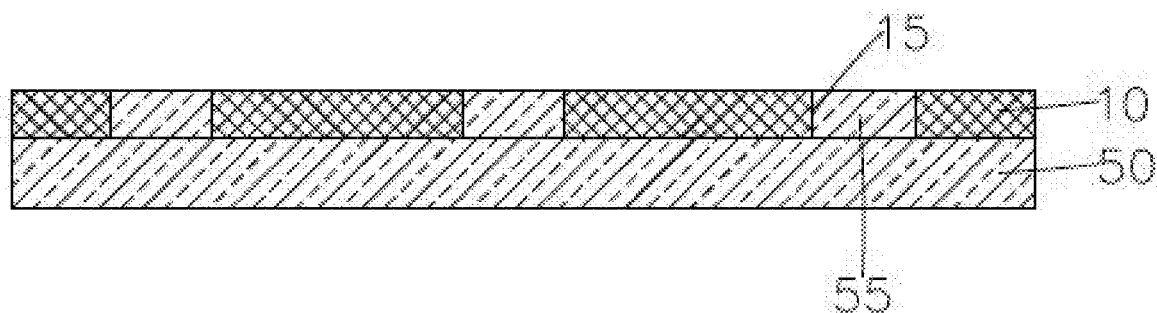
FIG. 5 is a schematic view illustrating step S2 in the manufacturing method of the flexible display panel.
Figure 6:
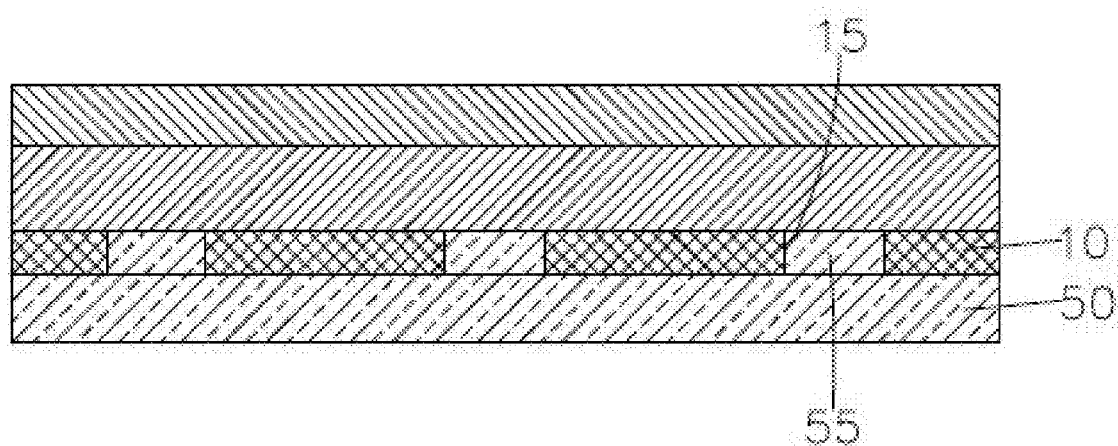
FIG. 6 is a schematic view illustrating step S3 in the manufacturing method of the flexible display panel.

Furthermore, each of the base protrusions 55 is a cylindrical shape. Moreover, each of the base protrusions 55 has a diameter of 2 to 3 mm and a height of 6 to 10 μm. Step S2: as shown in FIG. 5, removing the flexible protrusions 16 by laser cutting an upper side of the flexible substrate 10, and forming a plurality of first openings 15 in the flexible substrate 10, wherein the first openings 15 are disposed corresponding to the base protrusions 55. At this point, the base protrusions 55 are exposed from the first openings 15 and positioned therein. Step S3: as shown in FIG. 6, forming a display function layer 20 on the flexible substrate 10 and the base protrusions 55.

Moreover, the display function layer 20 formed in step S3 comprises a thin film transistor (TFT) layer 21, an OLED layer 22, and a thin film encapsulation layer (not illustrated) which are sequentially disposed on the flexible substrate 10.

Specifically, the TFT layer 21 is used to drive the OLED layer 22. The TFT layer 21 comprises a plurality of TFT members arranged in an array. The TFT members are a low temperature poly-silicon (LTPS) type or a metal-oxide semiconductor (MOS) type like an indium gallium zinc oxide (IGZO) MOS type.

In detail, the OLED layer 22 comprises a first electrode layer disposed on the TFT layer 21, a pixel defining layer disposed on the TFT layer 21 and the first electrode layer, an organic functional layer disposed on the first electrode layer, and a second electrode layer (not illustrated) on the pixel defining layer and the organic functional layer. The pixel defining layer defines a plurality of pixel openings arranged in an array in the first electrode layer. The organic functional layer is disposed in the pixel openings. An OLED device is constituted by the organic functional layer in each pixel opening, the first electrode layer under the organic functional layer, and the second electrode layer above the organic functional layer.

Specifically, the first electrode layer and the second electrode layer serve as an anode and a cathode of the OLED device, respectively. The organic functional layer comprises a hole injection layer, a hole transport layer, a light emitting layer, an electron transport layer, and an electron injection layer which are sequentially disposed from bottom to top. Each of the first electrode layer, the second electrode layer, and the organic functional layer can be formed by a vapor deposition method.

Specifically, the thin film encapsulation layer comprises an inorganic barrier layer and an organic buffer layer (not illustrated) which are stacked one above the other.

Figure 7:
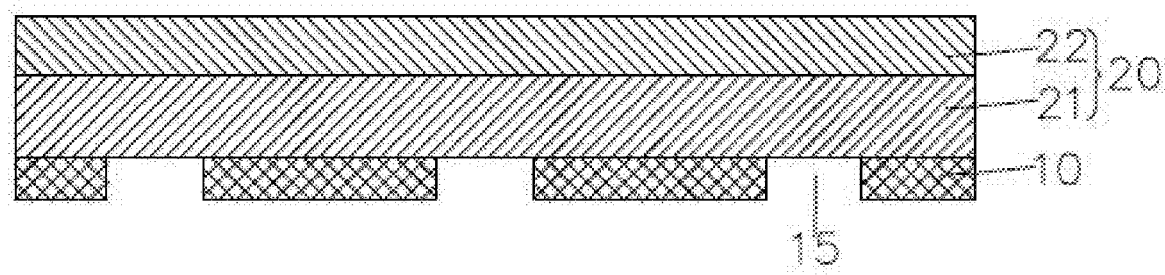
FIG. 7 is a schematic view illustrating step S4 in the manufacturing method of the flexible display panel.

Step S4: as shown in FIG. 7, one side of the flexible substrate 10 adjacent to the base substrate 50 is laser scanned to separate the base substrate 50 from the flexible substrate 10, and the flexible substrate 10 is removed from the base substrate 50.

Figure 8:
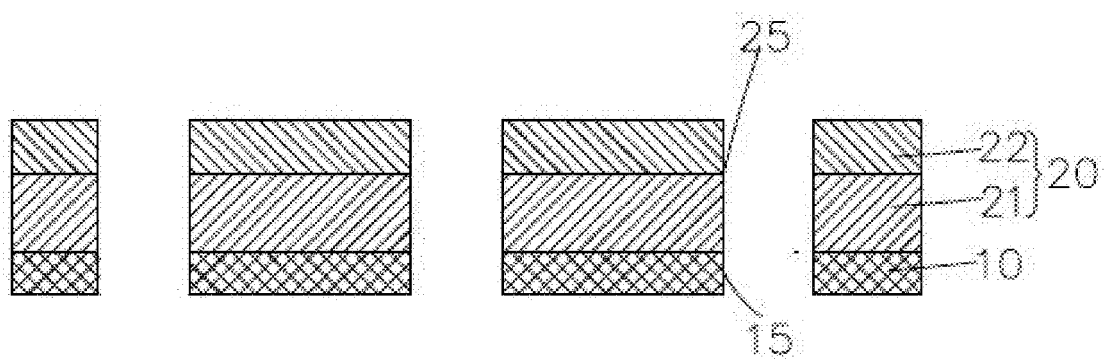
FIG. 8 is a schematic view illustrating step S5 in the manufacturing method of the flexible display panel.

Step S5: as shown in FIG. 8, cutting the display function layer 20 by laser cutting, and forming in the display function layer 20 a plurality of second openings 25 disposed corresponding to the first openings 15. The first opening 15 and the second opening 25 together form a camera opening of the flexible display panel.

Specifically, in step S5, the display function layer 20 may be cut only from an upper side of the display function layer 20 by laser cutting, or may be cut from upper and lower sides of the display function layer 20 by laser cutting to reduce difficulty in cutting the display function layer 20.

In the manufacturing method of the flexible display panel, the base protrusions 55 are disposed on the base substrate 50, the flexible substrate 10 is cut to form the first openings 15 by using the base protrusions 55, and then the display function layer 20 alone is cut to form the second openings 25 arranged corresponding to the first openings 15. The first openings 15 and the second openings 25 together constitute a camera opening of the flexible display panel, whereby effectively reducing difficulty in making openings in the flexible display panel.

Based on the manufacturing method of the flexible display panel mentioned above, the present invention further provides a base substrate 50 for manufacturing a flexible display panel. The flexible display panel comprises a flexible substrate 10 and a display function layer 20 disposed on the flexible substrate 10, a plurality of first openings 15 are defined in the flexible substrate 10, a plurality of second openings 25 disposed corresponding to the first openings 15 are defined in the display function layer 20, a plurality of base protrusions 55 are disposed on the base substrate 50 for manufacturing the flexible display panel, the flexible substrate 10 is coated on the base substrate 50 for manufacturing the flexible display panel, and the base protrusions 55 are disposed corresponding to the first openings 15 in flexible substrate 10.

Moreover, the base protrusions 55 and the base substrate 50 for manufacturing the flexible display panel are made of a same material, and the base substrate 50 for manufacturing the flexible display panel is a glass substrate. In detail, each of the base protrusions 55 is a cylindrical shape, and each of the base protrusions 55 has a diameter of 2 to 3 mm and a height of 6 to 10 μm.

Specifically, the base protrusions 55 are disposed corresponding to positions where camera openings are to be formed in the flexible display panel so as to raise a height of the base substrate 50 at these positions. After the flexible substrate 10 is coated, the flexible substrate 10 has a thinner thickness at edges of the base protrusions 55, thereby facilitating subsequent cutting the flexible substrate 10 to form openings therein.

In detail, the flexible substrate 10 is a polyimide substrate. Furthermore, the display function layer 20 comprises a TFT layer 21, an OLED layer 22, and a thin film encapsulation layer which are sequentially stacked on the flexible substrate 10.

Specifically, the TFT layer 21 is used to drive the OLED layer 22. The TFT layer 21 includes a plurality of TFT members arranged in an array. The TFT members each are a low temperature polysilicon type or a metal oxide semiconductor type such as indium gallium zinc oxide or metal oxide semiconductor type.

Specifically, the OLED layer 22 includes a first electrode layer disposed on the TFT layer 21, a pixel defining layer disposed on the TFT layer 21 and the first electrode layer, and an organic functional layer disposed on the first electrode layer, and a second electrode layer disposed on the pixel defining layer and the organic functional layer. The pixel defining layer defines a plurality of pixel openings arranged in an array in the first electrode layer. The organic functional layer is disposed in the pixel openings. An OLED device is constituted by the organic functional layer in each pixel opening, the first electrode layer under the organic functional layer, and the second electrode layer on the organic functional layer.

In detail, the first electrode layer and the second electrode layer serve as an anode and a cathode of the OLED device, respectively. The organic functional layer comprises a hole injection layer, a hole transport layer, a light emitting layer, an electron transport layer, and an electron injection layer which are sequentially disposed from bottom to top. Each of the first electrode layer, the second electrode layer, and the organic functional layer can be formed by a vapor deposition method.

Specifically, the thin film encapsulation layer comprises an inorganic barrier layer and an organic buffer layer which are stacked one above the other.

On the base substrate 50 for manufacturing the flexible display panel, there are base protrusions 55 for forming the first openings 15 in the flexible substrate 10. Such configuration can effectively reduce difficulty in making openings in the flexible display panel and improve production yields of the flexible display panel.

In summary, the present invention provides a manufacturing method of a flexible display panel. First, a flexible substrate is coated on a base substrate where base protrusions are disposed. Flexible protrusions of the flexible substrate, which are disposed corresponding to the base protrusions, are laser cut to form first openings in the flexible substrate. Then, a display function layer is formed on the flexible substrate and the base protrusions. Finally, the flexible substrate is removed from the base substrate, and the display function layer is cut by laser cutting to form second openings which are arranged corresponding to the first openings and defined in the display function layer. By means of the base protrusions disposed on the base substrate, the first openings can be formed in the flexible substrate, and then the display function layer alone is cut to form the second openings disposed corresponding to the first openings. It can effectively reduce difficulty of making openings in the flexible display panel. The present invention provides a base substrate for manufacturing a flexible display panel. The base substrate is provided with base protrusions for forming first openings in the flexible substrate, which can effectively reduce difficulty of making openings in the flexible display panel and improve production yields of the flexible display panel.

It is to be understood that equivalent changes and modifications can be made by persons of ordinary skill in the art in accordance with the technical solutions and technical concept of the present invention, and all such changes and modifications are regarded as falling within the scope of the present invention.

What is claimed is:

1. A manufacturing method of a flexible display panel, comprising steps as follows:
    S1: providing a base substrate which comprises a plurality of base protrusions thereon, and coating a flexible substrate on the base substrate and the base protrusions, wherein the flexible substrate comprises a plurality of flexible protrusions disposed corresponding to the base protrusions;
    S2: removing the flexible protrusions by laser cutting, and forming a plurality of first openings in the flexible substrate;
    S3: forming a display function layer on the flexible substrate and the base protrusions;
    S4: separating the base substrate from the flexible substrate, and removing the flexible substrate from the base substrate;

S5: cutting the display function layer by laser cutting, and forming in the display function layer a plurality of second openings disposed corresponding to the first openings.

2. The manufacturing method of the flexible display panel according to claim 1, wherein in step S1, the base protrusions and the base substrate are made of a same material, and the base substrate is a glass substrate.

3. The manufacturing method of the flexible display panel according to claim 1, wherein in step S1, each of the base protrusions is a cylindrical shape.

4. The manufacturing method of the flexible display panel according to claim 3, wherein each of the base protrusions has a diameter of 2 to 3 mm and a height of 6 to 10 μm.

5. The manufacturing method of the flexible display panel according to claim 1, wherein in step S1, the flexible substrate is a polyimide substrate; forming the flexible substrate in step S1 comprises coating the base substrate with a layer of polyimide, and baking the layer of polyimide to obtain the flexible substrate made of polyimide.

6. The manufacturing method of the flexible display panel according to claim 1, wherein in step S2, an upper side of the flexible substrate is cut by laser cutting to remove the flexible protrusions.

7. The manufacturing method of the flexible display panel according to claim 1, wherein in step S4, one side of the flexible substrate adjacent to the base substrate is laser scanned to separate the base substrate from the flexible substrate; and in step S5, an upper side or both upper and lower sides of the display function layer are cut by laser cutting.

8. A base substrate for manufacturing a flexible display panel, wherein the flexible display panel comprises a flexible substrate and a display function layer disposed on the flexible substrate, a plurality of first openings are defined in the flexible substrate, a plurality of second openings disposed corresponding to the first openings are defined in the display function layer, a plurality of base protrusions are disposed on the base substrate for manufacturing the flexible display panel, the flexible substrate is coated on the base substrate for manufacturing the flexible display panel, and the base protrusions are disposed corresponding to the first openings in flexible substrate, wherein the base protrusions and the base substrate for manufacturing the flexible display panel are made of a same material, and the base substrate for manufacturing the flexible display panel is a glass substrate.

9. The base substrate for manufacturing the flexible display panel according to claim 8, wherein each of the base protrusions is a cylindrical shape, and each of the base protrusions has a diameter of 2 to 3 mm and a height of 6 to 10 μm.

* * * * *